US010229921B2

(12) United States Patent
Ando et al.

(10) Patent No.: US 10,229,921 B2
(45) Date of Patent: Mar. 12, 2019

(54) STRUCTURE FEATURING FERROELECTRIC CAPACITANCE IN INTERCONNECT LEVEL FOR STEEP SUB-THRESHOLD COMPLEMENTARY METAL OXIDE SEMICONDUCTOR TRANSISTORS

(71) Applicant: International Business Machines Corporation, Armonk, NY (US)

(72) Inventors: Takashi Ando, Tuckahoe, NY (US); Karthik Balakrishnan, White Plains, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/424,278

(22) Filed: Feb. 3, 2017

(65) Prior Publication Data
US 2018/0226415 A1    Aug. 9, 2018

(51) Int. Cl.
*H01L 29/40*     (2006.01)
*H01L 29/51*     (2006.01)
*H01L 29/66*     (2006.01)
*H01L 29/78*     (2006.01)
*H01L 27/11507*  (2017.01)
*H01L 27/06*     (2006.01)
(Continued)

(52) U.S. Cl.
CPC .............. *H01L 27/11507* (2013.01); *H01L 21/823814* (2013.01); *H01L 21/823878* (2013.01); *H01L 27/0629* (2013.01); *H01L 27/092* (2013.01); *H01L 28/82* (2013.01); *H01L 29/0649* (2013.01); *H01L 29/0847* (2013.01)

(58) Field of Classification Search
CPC ......... H01L 27/11502; H01L 27/11504; H01L 27/11507; H01L 27/0629; H01L 27/092; H01L 27/0294; H01L 21/28291; H01L 21/823821; H01L 23/5223
See application file for complete search history.

(56) References Cited

U.S. PATENT DOCUMENTS 5,907,762 A    5/1999  Evans et al.
6,150,206 A   11/2000  Oh
(Continued)

OTHER PUBLICATIONS

List of IBM Patents or Patent Applications Treated as Related dated Nov. 16, 2017, 2 pages.

(Continued)

*Primary Examiner* — David Spalla
(74) *Attorney, Agent, or Firm* — Scully, Scott, Murphy & Presser, P.C.; L. Jeffrey Kelly, Esq.

(57) ABSTRACT

After forming a first functional gate stack located on a first body region of a first semiconductor material portion located in a first region of a substrate and a second functional gate stack located on a second body region of a second semiconductor material portion located in a second region of the substrate, a ferroelectric gate interconnect structure is formed connecting the first functional gate stack and the second functional gate stack. The ferroelectric gate interconnect structure includes a U-shaped bottom electrode structure, a U-shaped ferroelectric material liner and a top electrode structure.

10 Claims, 17 Drawing Sheets

(51) Int. Cl.
*H01L 27/092* (2006.01)
*H01L 49/02* (2006.01)
*H01L 29/06* (2006.01)
*H01L 29/08* (2006.01)
*H01L 21/8238* (2006.01)

(56) References Cited

U.S. PATENT DOCUMENTS

| | | | |
|---|---|---|---|
| 6,326,651 B1 | 12/2001 | Manabe | |
| 6,603,161 B2 * | 8/2003 | Kanaya | H01L 27/11502 257/295 |
| 6,744,087 B2 | 6/2004 | Misewich et al. | |
| 8,247,855 B2 | 8/2012 | Summerfelt | |
| 2013/0026571 A1 | 1/2013 | Kawa et al. | |
| 2013/0285143 A1 | 10/2013 | Oh et al. | |
| 2015/0311217 A1 * | 10/2015 | Chavan | H01L 27/11507 257/295 |
| 2016/0064391 A1 | 3/2016 | Li et al. | |
| 2016/0225860 A1 | 8/2016 | Karda et al. | |
| 2016/0336319 A1 * | 11/2016 | Yang | H01L 27/0924 |

OTHER PUBLICATIONS

Lee, M.H. et al., "Prospects for Ferroelectric HfZrOx FETs with Experimentally CET=0.98nm, SSfor=42mV/dec, SSrev=28mV/dec, Switch-Off <0.2V, and Hysteresis-Free Strategies", Electron Devices Meeting (IEDM), 2015 IEEE International, pp. 22.5.1-22.6.4.

Li, K. et al., "Sub-60mV-Swing Negative-Capacitance FinFET without Hysteresis", Electron Devices Meeting (IEDM), 2015 IEEE International, pp. 22.6.1-22.6.4.

Ando, T. et al., "Integrated Ferroelectric Capacitor/Field Effect Transistor Structure," U.S. Appl. No. 15/264,142, filed Sep. 13, 2016, 36 pages.

Office Action dated Apr. 2, 2018 received in U.S. Appl. No. 15/815,326.

Office Action dated Apr. 2, 2018 received in U.S. Appl. No. 15/815,312.

\* cited by examiner

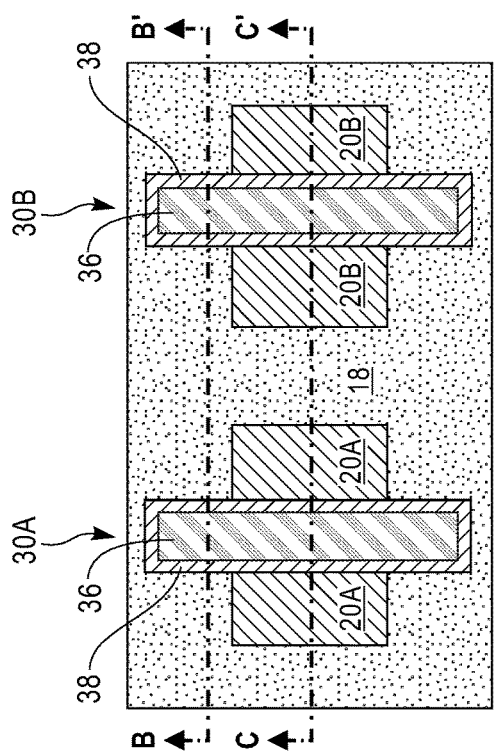
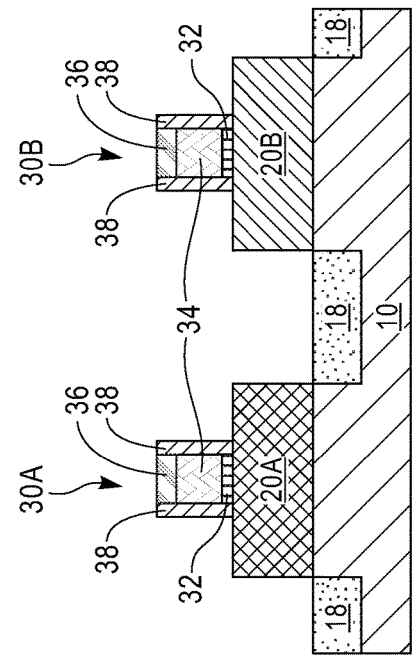
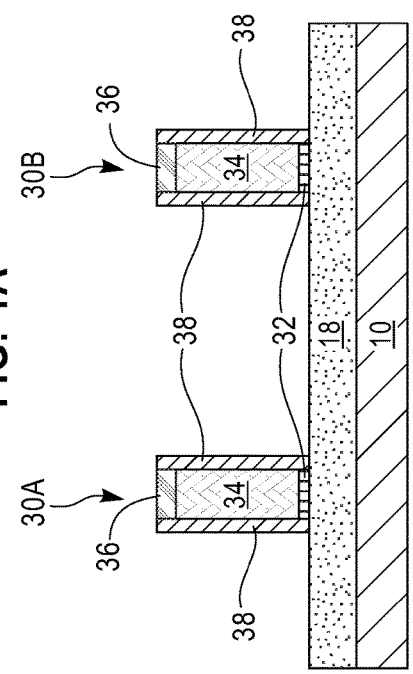
FIG. 1A
FIG. 1B
FIG. 1C

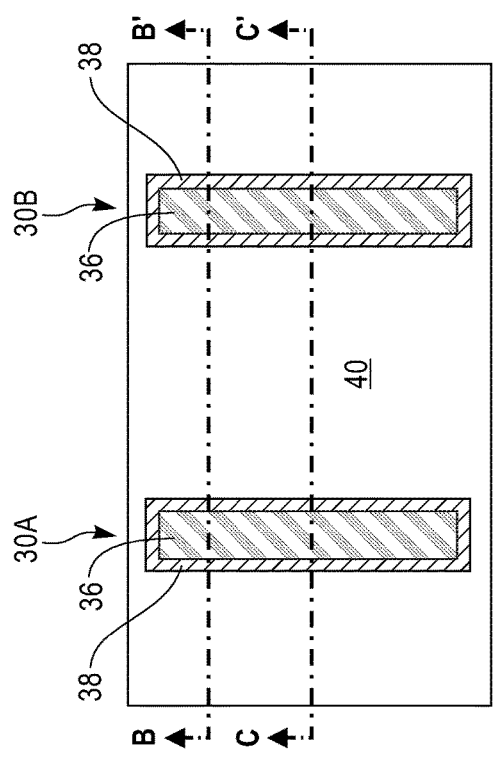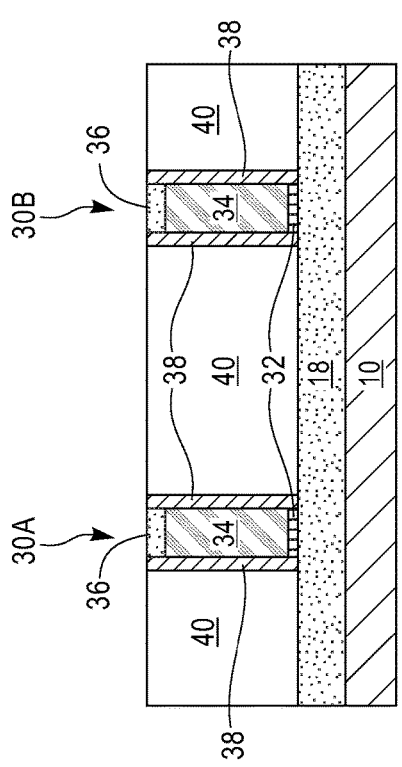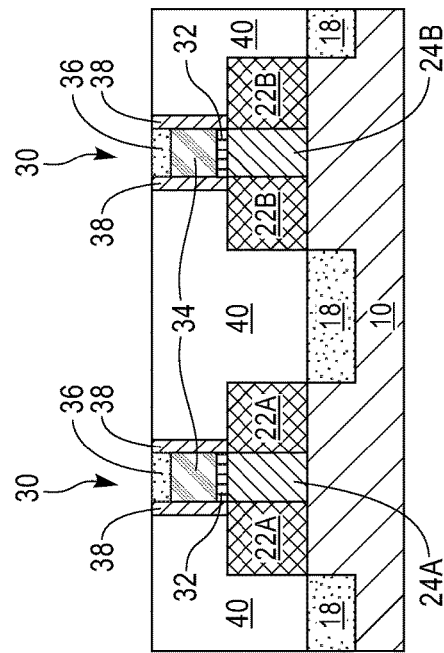

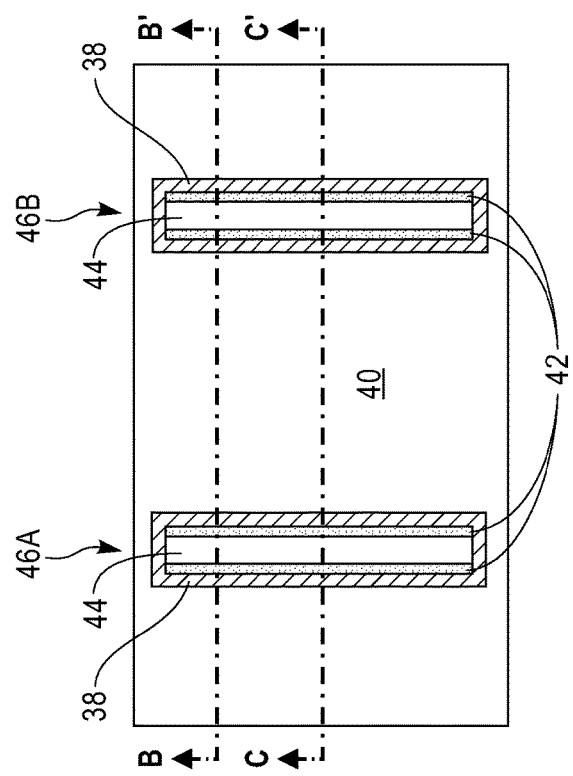
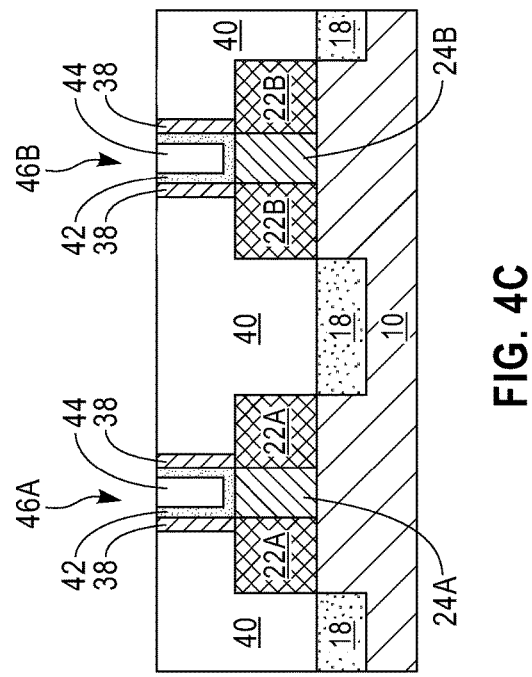
FIG. 4A
FIG. 4B
FIG. 4C

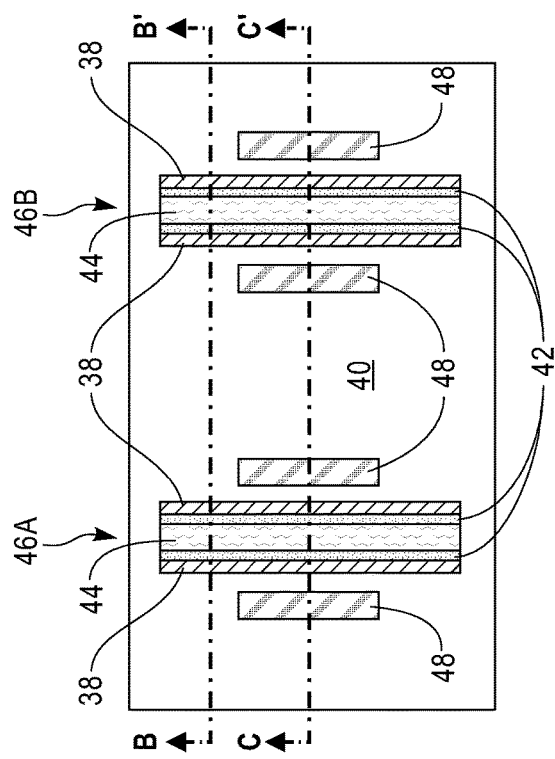
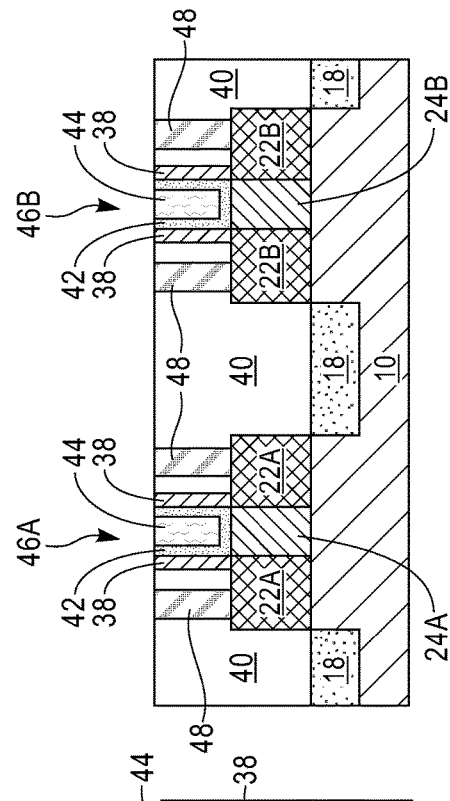
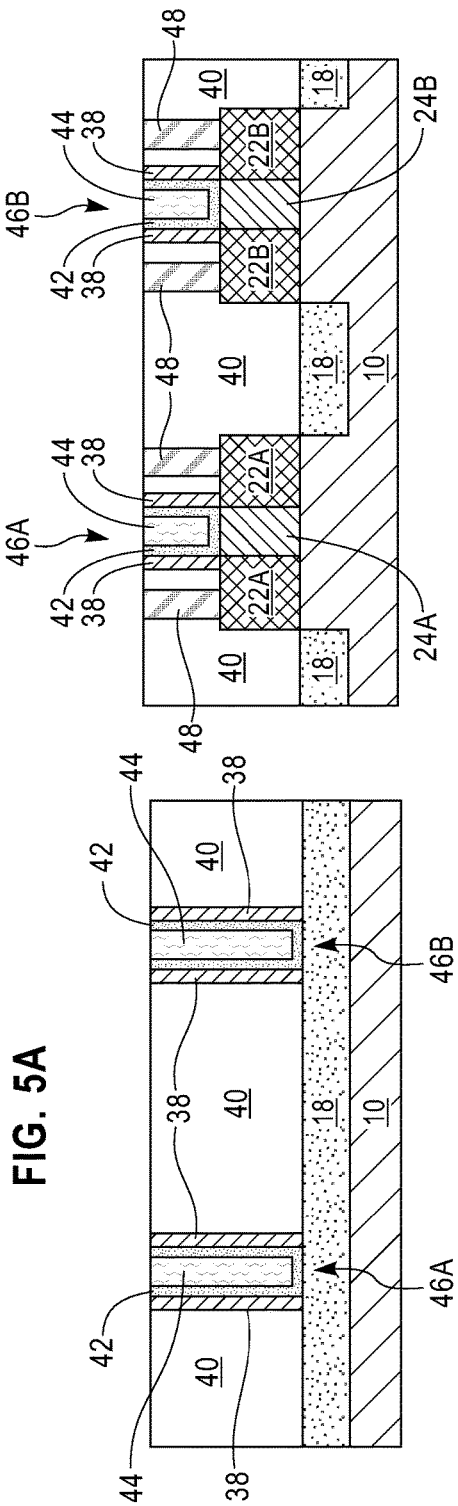
FIG. 5A
FIG. 5B
FIG. 5C

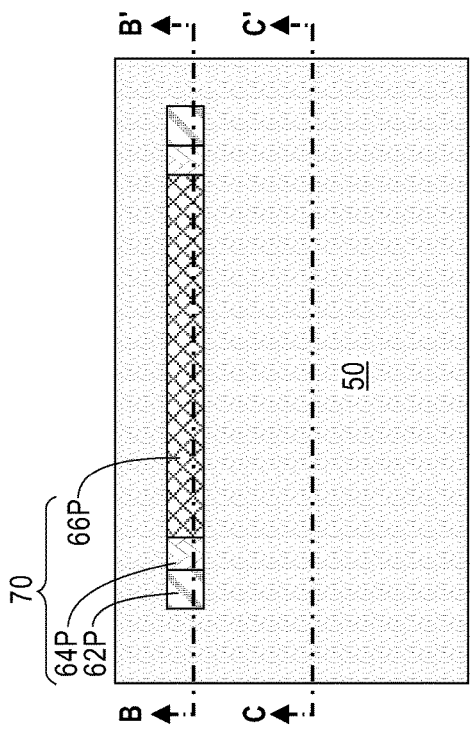
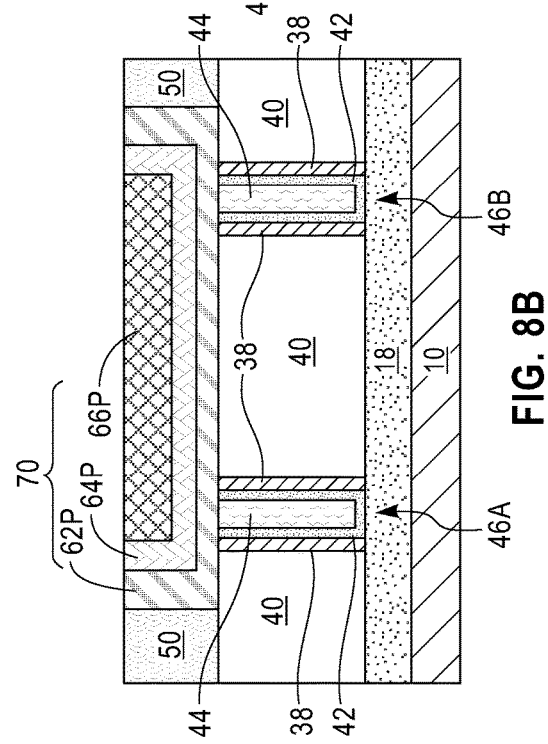
FIG. 8A
FIG. 8B
FIG. 8C

STRUCTURE FEATURING FERROELECTRIC CAPACITANCE IN INTERCONNECT LEVEL FOR STEEP SUB-THRESHOLD COMPLEMENTARY METAL OXIDE SEMICONDUCTOR TRANSISTORS

BACKGROUND

The present application relates to a semiconductor structure and a method of forming the same. More particularly, the present application relates to a semiconductor structure that includes a ferroelectric gate interconnect connecting underlying functional gate stacks of complementary metal oxide semiconductor (CMOS) transistors and a method of forming the same.

Ferroelectric field effect transistors (FETs) are attractive candidates for low power applications. FET structures coupling ferroelectric materials with the gate stacks of metal oxide semiconductor field effect transistors (MOSFETs) have been shown to demonstrate steep sub 60 mV/dec sub-threshold swing. However, no CMOS integration has been shown yet.

Moreover, to attain sufficient ferroelectric characteristics, the ferroelectric material film in a ferroelectric capacitor has to be relatively thick (on the order of 5 nm or greater). Using existing technology, integration of such a thick ferroelectric material film in a replacement gate process flow is challenging due to limited space for device formation and/or shorting of the ferroelectric capacitor. As such, there is a need for providing a method in which a ferroelectric capacitor can be readily integrated in a replacement gate process flow, while circumventing the space issue and/or shorting issue that hampers existing technology.

SUMMARY

The present application provides steep sub-threshold CMOS transistors by introducing ferroelectric materials into a gate interconnect structure that connects gate stacks of CMOS transistors. By "steep sub-threshold" it is meant a CMOS transistor having a threshold slope exceeding the conventional limit of 60 mV/decade.

In one aspect of the present application, a semiconductor structure is provided. The semiconductor structure includes a first functional gate stack located on a first body region of a first semiconductor material portion located in a first region of a substrate, a second functional gate stack located on a second body region of a second semiconductor material portion located in a second region of the substrate, and a ferroelectric gate interconnect structure connecting the first functional gate stack and the second functional gate stack.

In another aspect of the present application, a method of forming a semiconductor structure is provided. A first functional gate stack is formed on a first body region of a first semiconductor material portion located in a first region of a substrate and a second functional gate stack is formed on a second body region of a second semiconductor material portion located in a second region of the substrate. The first functional gate stack and the second functional gate stack are laterally surrounded by an interlevel dielectric (ILD) layer. A contact level dielectric layer is then formed over the ILD layer, the first functional gate stack and the second functional gate stack. After forming a gate interconnect opening extending through the contact level dielectric layer to expose a portion of the first functional gate stack and a portion of the second functional gate stack, a ferroelectric gate interconnect structure is formed in the gate interconnect opening.

In yet another aspect of the present application, a semiconductor structure is provided. The semiconductor structure includes a functional gate stack located on a body region of a semiconductor material portion located on a substrate and surrounded by an ILD layer and a ferroelectric gate contact structure located in a contact level dielectric layer present on the ILD layer and vertically contacting the functional gate stack.

BRIEF DESCRIPTION OF THE DRAWINGS

FIG. 1A is a top-down view of a first exemplary semiconductor structure including a first sacrificial gate structure located on a portion of a first semiconductor material portion, a second sacrificial gate structure located on a portion of a second semiconductor material portion and a shallow trench isolation (STI) layer surrounded a bottom portion of each of the first and second semiconductor material portions in accordance with a first embodiment of the present application.

FIG. 1B is a cross-sectional view of the first exemplary semiconductor structure of FIG. 1A along line B-B'.

FIG. 1C is a cross-sectional view of the first exemplary semiconductor structure of FIG. 1A along line C-C'.

FIG. 3A is a top-down view of the first exemplary semiconductor structure of FIGS. 2A-2C after forming an interlevel dielectric (ILD) layer on the STI layer and laterally surrounding the first and second sacrificial gate structures.

FIG. 3B is a cross-sectional view of the first exemplary semiconductor structure of FIG. 3A along line B-B'.

FIG. 3C is a cross-sectional view of the first exemplary semiconductor structure of FIG. 3A along line C-C'.

FIG. 4A is a top-down view of the first exemplary semiconductor structure of FIGS. 3A-3C after forming a first functional gate stack replacing a first sacrificial gate stack in the first sacrificial gate structure and forming a second functional gate stack replacing a second sacrificial gate stack in the second sacrificial gate structure.

FIG. 4B is a cross-sectional view of the first exemplary semiconductor structure of FIG. 4A along line B-B'.

FIG. 4C is a cross-sectional view of the first exemplary semiconductor structure of FIG. 4A along line C-C'.

FIG. 5A is a top-down view of the first exemplary semiconductor structure of FIGS. 4A-4C after forming source/drain contact structures contacting the first source/drain regions and the second source/drain regions.

FIG. 5B is a cross-sectional view of the first exemplary semiconductor structure of FIG. 5A along line B-B'.

FIG. 5C is a cross-sectional view of the first exemplary semiconductor structure of FIG. 5A along line C-C'.

FIG. 8A is a top-down view of the first exemplary semiconductor structure of FIGS. 7A-7C after forming a ferroelectric gate interconnect structure within the gate interconnect opening.

FIG. 8B is a cross-sectional view of the first exemplary semiconductor structure of FIG. 8A along line B-B'.

FIG. 8C is a cross-sectional view of the first exemplary semiconductor structure of FIG. 8A along line C-C'.

DETAILED DESCRIPTION

Figure 2A:
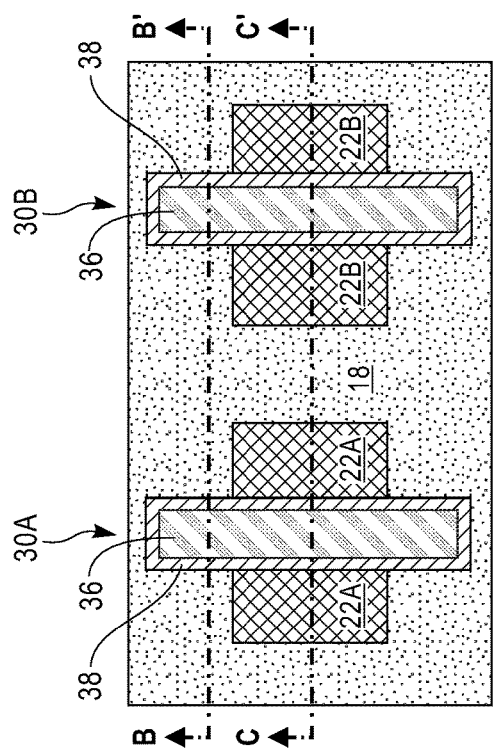
FIG. 2A is a top-down view of the first exemplary semiconductor structure of FIGS. 1A-1C after forming first source/drain regions within the first semiconductor material portion and forming second source/drain regions within the second semiconductor material portion.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIGS. 1A-1C, there are illustrated a first exemplary semiconductor structure that can be employed in accordance with a first embodiment of the present application. The first exemplary semiconductor structure includes a first sacrificial gate stack 30A located on a portion of a first semiconductor material portion 20A and a second sacrificial gate stack 30B located on a portion of a second semiconductor material portion 20B. The first semiconductor material portion 20A is located in a first device region of a substrate 10, and the second semiconductor material portion 20B is located in a second device region of the substrate 10. In one embodiment, the first device region can be a p-type FET (pFET) region, and the second device region can be an n-type FET (nFET) region.

In some embodiments, each semiconductor material portion 20A, 20B may be a semiconductor fin. The term "semiconductor fin" denotes a contiguous semiconductor structure that extends upward from a surface of a substrate (e.g., substrate 10) and has a pair of vertical sidewalls that are parallel to each other. As used herein, a surface is "vertical" if there exists a vertical plane from which the surface does not deviate by more than three times the root mean square roughness of the surface. The height and width of the semiconductor fins can vary. In one embodiment of the present application, each semiconductor fin has a height from 10 nm to 100 nm, and a width from 4 nm to 30 nm. In another embodiment, each semiconductor material portion 20A, 20B may be a semiconductor nanowire. In a further embodiment, each semiconductor material portion 20A, 20B may be a planar active semiconductor region for forming a planar semiconductor device.

In one embodiment, the semiconductor material portions 20A, 20B can be formed by providing a bulk semiconductor substrate including a semiconductor material throughout, and by patterning an upper portion of the bulk semiconductor substrate. In this case, the remaining portion of the bulk semiconductor substrate underlying the semiconductor material portions 20A, 20B constitutes the substrate 10. The semiconductor material portions 20A, 20B are adjoined to the substrate 10 and are comprised of the same semiconductor material as the upper portion of the bulk semiconductor substrate.

The bulk semiconductor substrate may include a semiconductor material or a stack of semiconductor materials such as, for example, Si, Ge, SiGe, SiC, SiGeC or an III-V compound semiconductor. In one embodiment, the bulk semiconductor substrate includes a single crystalline semiconductor material such as, for example, single crystalline silicon. The thickness of the bulk semiconductor substrate can be from 30 µm to about 2 mm, although lesser and greater thicknesses can also be employed. The bulk semiconductor substrate may be doped with dopants of p-type or n-type. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. The dopant concentration in the bulk semiconductor substrate can range from $1\times10^{14}$ atoms/cm$^3$ to $3\times10^{17}$ atoms/cm$^3$.

In one embodiment, the upper portion of the bulk semiconductor substrate can be patterned using lithography and etching to provide the semiconductor material portions 20A, 20B. For example, a mask layer (not shown) can be applied over a topmost surface of the bulk semiconductor substrate and lithographically patterned to define a set of areas covered by a patterned mask layer. The mask layer can be a photoresist layer or a photoresist layer in conjunction with hardmask layer(s). The bulk semiconductor substrate is then patterned by an anisotropic etch using the patterned mask layer as an etch mask. In one embodiment, a dry etch such as, for example, reactive ion etch (RIE) can be used. In another embodiment, a wet etch using a chemical etchant can be used. In still a further embodiment, a combination of dry etch and wet etch can be used. After formation of the semiconductor material portions 20A, 20B, the patterned mask layer can be removed, for example, by oxygen plasma. Other methods known in the art, such as sidewall image transfer (SIT) or directional self-assembly (DSA), can also be used to pattern the upper portion of the bulk semiconductor substrate to provide the semiconductor material portions 20A, 20B.

In another embodiment, the semiconductor material portions 20A, 20B can be formed by providing a semiconductor-on-insulator (SOI) substrate including a top semiconductor layer, a buried insulator layer, and a handle substrate, and by patterning the top semiconductor layer (not shown). In this case, the remaining portions of the top semiconductor layer after patterning constitute the semiconductor material portions 20A, 20B, and the buried insulator layer constitutes the substrate 10.

In the case in which a bulk semiconductor substrate is employed, and after formation of semiconductor material portions 20A, 20B, a shallow trench isolation (STI) layer 18 is formed surrounding a bottom portion of each semiconductor material portion 20A, 20B. The STI layer 18 includes a dielectric material such as silicon dioxide. The STI layer 18 can be formed by depositing a dielectric material over the semiconductor material portions 20A, 20B and the substrate 10. The deposition of the dielectric material can be performed, for example, by chemical vapor deposition (CVD) or spin coating. Excess portions of the deposited dielectric material can be removed from above the top surfaces of the semiconductor material portions 20A, 20B, for example, by planarization such as chemical mechanical planarization (CMP). The top surface of the STI layer 18 can be coplanar with the top surfaces of the semiconductor material portions 20A, 20B. Subsequently and in some embodiments, the STI layer 18 is recessed relative to the top surfaces of the semiconductor material portions 20A, 20B. An etch back process that is selective to the semiconductor material of the semiconductor material portions 20A, 20B can be performed to recess the STI layer 18. For example, if the STI layer 18 includes silicon dioxide, a wet etch employing hydrofluoric acid can be employed to recess the STI layer 18. Surfaces of an upper portion of each semiconductor material portion 20A, 20B are thus physically exposed.

Each sacrificial gate stack 30A, 30B can include, from bottom to top, a sacrificial gate dielectric 32, a sacrificial gate conductor 34 and a sacrificial gate cap 36. The term "sacrificial gate stack" is used throughout the present application to denote a material stack that serves as a placeholder material for a functional gate stack to be subsequently formed. The term "functional gate stack" as used herein refers to a permanent gate stack used to control output current (i.e., flow of carriers in the channel) of a semiconducting device through electrical fields or magnetic fields.

The sacrificial gate stacks 30A, 30B can be formed by first providing a sacrificial material stack (not shown) that includes, from bottom to top, a sacrificial gate dielectric layer, a sacrificial gate conductor layer and a sacrificial gate cap layer over the semiconductor material portions 20A, 20B and the STI layer 18, and by subsequently patterning the sacrificial material stack.

The sacrificial gate dielectric layer can include silicon oxide, silicon nitride, or silicon oxynitride. The sacrificial gate dielectric layer can be formed utilizing a conventional deposition process such as, for example, CVD or physical vapor deposition (PVD). The sacrificial gate dielectric layer can also be formed by conversion of a surface portion of each semiconductor material portion 20A, 20B utilizing thermal oxidation or nitridation. The thickness of the sacrificial gate dielectric layer can be from 1 nm to 10 nm, although lesser and greater thicknesses can also be employed. In some embodiments of the present application, the sacrificial gate dielectric layer can be omitted.

The sacrificial gate conductor layer can include a semiconductor material such as polysilicon or a silicon-containing semiconductor alloy such as a silicon-germanium alloy. Other types of materials such as metals can also be used as the sacrificial gate conductor layer. The sacrificial gate conductor layer can be formed utilizing a conventional deposition process such as, for example, CVD or PECVD. The thickness of the sacrificial gate conductor layer can be from 20 nm to 300 nm, although lesser and greater thicknesses can also be employed.

The sacrificial gate cap layer can include a dielectric material such as an oxide, a nitride or an oxynitride. In one embodiment, the sacrificial gate cap layer is composed of silicon nitride. The sacrificial gate cap layer can be formed utilizing a conventional deposition process such as, for example, CVD or PECVD. The sacrificial gate cap layer that is formed may have a thickness from 10 nm to 200 nm, although lesser and greater thicknesses can also be employed.

The sacrificial material stack can be patterned by lithography and etching. For example, a photoresist layer (not shown) may be applied over the topmost surface of the sacrificial material stack and lithographically patterned by lithographic exposure and development. The pattern in the photoresist layer is sequentially transferred into the sacrificial material stack by at least one anisotropic etch. The anisotropic etch can be a dry etch such as, for example, RIE, a wet etch or a combination thereof. The remaining photoresist layer can be subsequently removed by, for example, ashing.

Each remaining portion of the sacrificial gate dielectric layer within a sacrificial gate stack 30A, 30B constitutes a sacrificial gate dielectric 32, each remaining portion of the sacrificial gate conductor layer within a sacrificial gate stack 30A, 30B constitutes a sacrificial gate conductor 34, and each remaining portion of the sacrificial gate cap layer within a sacrificial gate stack 30A, 30B constitutes a sacrificial gate cap 36. The sacrificial gate stacks 30A, 30B straddle portions of the semiconductor material portions 20A, 20B that become body regions of FETs. By "straddle" it is meant that the sacrificial gate stack formed in each device region is in direct contact with a top surface and two vertical sidewalls of each semiconductor material portion.

After forming the sacrificial gate stacks 30A, 30B, a gate spacer 38 is formed on sidewalls of each sacrificial gate stack 30A, 30B. Collectively, one of the sacrificial gate stacks 30A, 30B and a corresponding gate spacer 38 can be referred to as a sacrificial gate structure. The gate spacers 38 can be formed by depositing a spacer dielectric material such as, for example, silicon dioxide and/or silicon nitride, and thereafter horizontal portions of the deposited spacer dielectric material are etched to provide each gate spacer 38. The width of each gate spacer 38, as measured at the base, can be form 5 nm to 100 nm, although lesser and greater widths can also be employed. In some embodiments, gate spacer formation may be omitted.

Figure 2C:
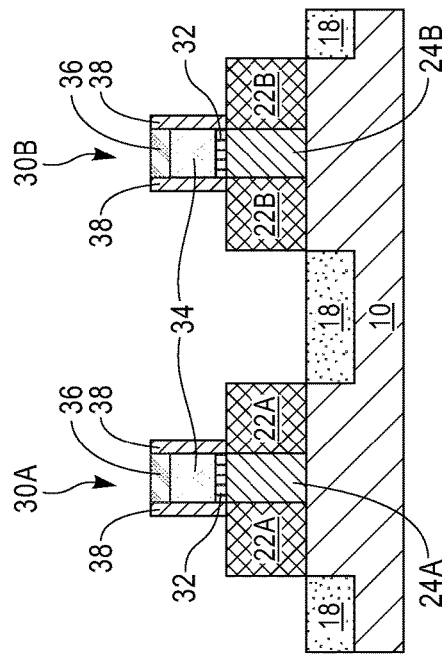
FIG. 2C is a cross-sectional view of the first exemplary semiconductor structure of FIG. 2A along line C-C'.
Figure 2B:
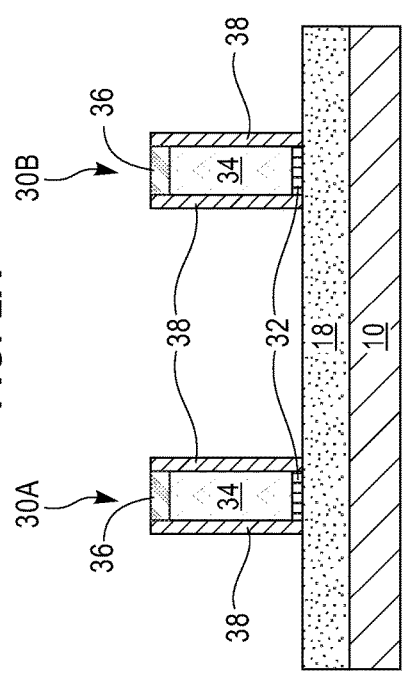
FIG. 2B is a cross-sectional view of the first exemplary semiconductor structure of FIG. 2A along line B-B'.

Referring now to FIGS. 2A-2C, there are illustrated the first exemplary semiconductor structure of FIGS. 1A-1C after forming a first source region and a first drain region (collectively referred to as first source/drain regions 22A) within portions of the first semiconductor material portion 20A that do not underlie the first sacrificial gate stack 30A and forming a second source region and a second drain region (collectively referred to as second source/drain regions 22B) within portions of the second semiconductor material portion 20B that do not underlie the second sacrificial gate stack 30B. The first source/drain regions 22A can include p-type dopants for pFETs, and the second source/drain regions 22B can include n-type dopants for nFETs. In one embodiment, ion implantation of dopants (i.e., p-type or n-type dopants) can be performed to provide the first source/drain regions 22A and the second source/drain regions 22B.

The unimplanted portion of the first semiconductor material portion 20A constitutes a first body region 24A, and the unimplanted portion of the second semiconductor material portion 20B constitutes a second body region 24B. An activation anneal can be subsequently performed to activate the implanted dopants in the first and second source/drain regions 22A, 22B.

Optionally, a selective epitaxy process can be performed to deposit a first semiconductor material on physically exposed semiconductor surfaces of the first semiconductor portion 20A, forming a first raised source region and a first raised drain region (collectively referred to as first raised source/drain regions) (not shown) directly on the first source/drain regions 22A, while masking the second device region. Another selective epitaxy process can be performed to deposit a second semiconductor material on physically exposed semiconductor surfaces of the second semiconductor portion 20B, forming a second raised source region and a second raised drain region (collectively referred to as second raised source/drain regions) (not shown) directly on the second source/drain regions 22B, while masking the first device region. The formation of the first and second raised source/drain regions can be omitted.

Referring now to FIGS. 3A-3C, there are illustrated the first exemplary semiconductor structure of FIGS. 2A-2C after forming an interlevel dielectric (ILD) layer 40 over the source/drain regions 22A, 22B and the STI layer 18. The ILD layer 40 laterally surrounds the first sacrificial gate structure (30A, 38) and the second sacrificial gate structure (30B, 38). The ILD layer 40 may include a dielectric material that may be easily planarized. For example, the ILD layer 40 can include a doped silicate glass, an undoped silicate glass (silicon oxide), an organosilicate glass (OSG) or a porous dielectric material. The ILD layer 40 can be formed, for example, by CVD, PVD or spin coating. The ILD layer 40 can be initially formed such that an entirety of the topmost surface of the ILD layer 40 is formed above the topmost surfaces of the sacrificial gate stacks 30A, 30B (i.e., top surfaces of the sacrificial gate caps 36). The ILD layer 40 can be subsequently planarized, for example, by CMP and/or a recess etch using the sacrificial gate caps 36 as a polishing and/or etch stop. After the planarization, the ILD layer 40 has a topmost surface coplanar with the topmost surfaces of the sacrificial gate stacks 30A, 30B.

Referring now to FIGS. 4A-4C, there are illustrated the first exemplary semiconductor structure of FIGS. 3A-3C after replacing the first sacrificial gate stack 30A with a first functional gate stack 46A and the second sacrificial gate stack 30B with a second functional gate stack 46B. Each functional gate stack 46A, 46B is laterally surrounded by a gate spacer 38. Collectively, one of the functional gate stacks 46A, 46B and a corresponding gate spacer 38 can be referred to as a functional gate structure. The first functional gate stack 46A is formed in the first device region straddling the first body region 24A of the first semiconductor material portion 20A and overlying the STI layer 18, and the second functional gate stack 46B is formed in the second device region straddling the second body region 24B of the second semiconductor material portion 20B and overlying the SIT layer 18.

The replacing each sacrificial gate stack 30A, 30B includes removing components of each sacrificial gate stack 30A, 30B utilizing an etching process and thereafter a functional gate stack 46A, 46B is formed in a gate cavity that comprises a volume of each removed sacrificial gate stack 30A, 30B. The forming of each functional gate stack 46A, 46B includes depositing the various material layers that provide each functional gate stack 46A, 46B and performing a planarization process such as, for example, CMP, to remove the various material layers from above the topmost surface of the ILD layer 40. After planarization and as shown in FIGS. 4B and 4C, portions of the various material layers remain in each gate cavity forming each functional gate stack 46A, 46B.

In the illustrated embodiment, each functional gate stack 46A, 46B includes a gate dielectric 42 and a gate electrode 44. As is shown, the gate dielectric 42 is U-shaped, thus the sidewalls and a bottommost surface of the gate electrode 44 are surrounded by the gate dielectric 42. By "U-shaped" it is meant a structure that includes a horizontal portion and two vertical extending portions that extend upwards from each end of the horizontal portion. In some embodiments and as is shown, the topmost surfaces of each of the gate dielectric 42 and the gate electrode 44 are coplanar with each other as well as being coplanar with the topmost surface of the ILD layer 40.

The gate dielectric 42 may include any gate dielectric material. The gate dielectric material that provides the gate dielectric 42 can be an oxide, nitride, and/or oxynitride. In one example, the gate dielectric material that provides the gate dielectric 42 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric 42.

The gate dielectric material used in providing the gate dielectric 42 can be formed by any deposition process including, for example, CVD, plasma enhanced chemical vapor deposition (PECVD), PVD, or atomic layer deposition (ALD). The thickness of the gate dielectric 42 can be from 1 nm to 10 nm, although lesser and greater thicknesses can also be employed.

The gate electrode 44 may include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof.

The gate electrode 44 can be formed utilizing a deposition process including, for example, CVD, PECVD, PVD, ALD, or other like deposition processes. When a metal silicide is formed, a conventional silicidation process is employed.

Optionally, in some embodiments of the present application, a U-shaped work function metal (not shown) can be formed between the gate dielectric 42 and the gate electrode 44 to tune the threshold voltage of the FETs to be formed. The work function metal can be formed, for example, by CVD, PVD, or ALD. The thickness of the work function metal can be from 1 nm to 10 nm, although lesser or greater thicknesses can also be employed.

Referring now to FIGS. 5A-5C, there are illustrated the first exemplary semiconductor structure of FIGS. 4A-4C after forming source/drain contact structures 48 contacting the first source/drain regions 22A and the second source/drain regions 22B. The source/drain contact structures 48 can be formed by first forming source/drain contact openings (not shown) on opposite sides of functional gate stacks 46A, 46B. Each source/drain contact opening extends through the ILD layer 40, exposing a portion of one the source/drain regions 22A, 22B. The source/drain contact openings can be formed by applying a mask layer (not shown) over the ILD layer 40, the functional gate stacks 46A, 46B and the gate spacers 38, and then lithographically patterning the mask layer to form openings therein. Each opening overlies a portion of one of the source/drain regions 22A, 22B. The mask layer can be a photoresist layer or a photoresist layer in conjunction with hardmask layer(s). The pattern in the mask layer is transferred through the ILD layer 40 by an anisotropic etch to form the source/drain contact openings. The anisotropic etch can be a dry etch such as RIE or a wet etch that removes the dielectric material that provides the ILD layer 40 selective to the semiconductor material that provides the semiconductor material portions 20A, 20B. After forming the source/drain contact openings, the remaining mask layer can be removed by oxygen-based plasma etching.

Subsequently, a conductive material is deposited within the source/drain contact openings. The conductive material may include a metal such as, for example, tungsten, aluminum, copper or their alloys. The conductive material can be deposited by any suitable deposition method such as, for example, CVD, PVD or plating. Excess portions of the deposited conductive material can be removed from above the top surface of the ILD layer 40 by a planarization process such as, for example, CMP to provide the final source/drain contact structures 48. Optionally, contact liners (not shown) may be formed on the sidewalls and bottom surfaces of the source/drain contact openings before filling the source/drain contact openings with the conductive material. In one embodiment, the contact liners may include TiN.

Figure 6A:
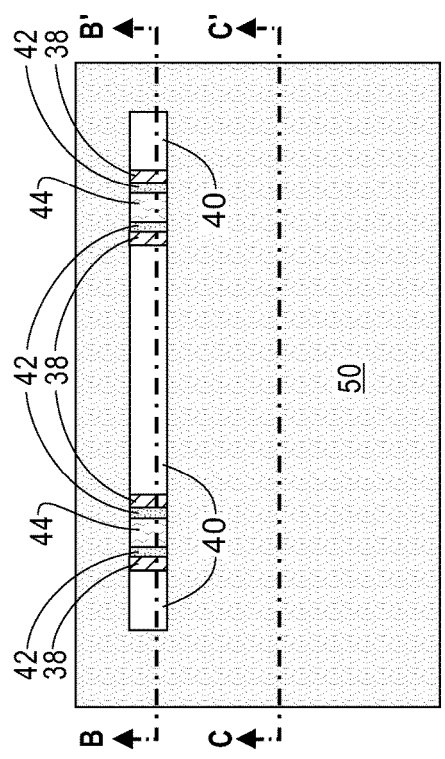
FIG. 6A is a top-down view of the first exemplary semiconductor structure of FIGS. 5A-5C after forming a contact level dielectric layer on the ILD layer and forming a gate interconnect opening exposing a portion of the first functional gate stack outside of the first semiconductor material portion and a portion of the second functional gate stack outside of the second semiconductor material portion.
Figure 6C:
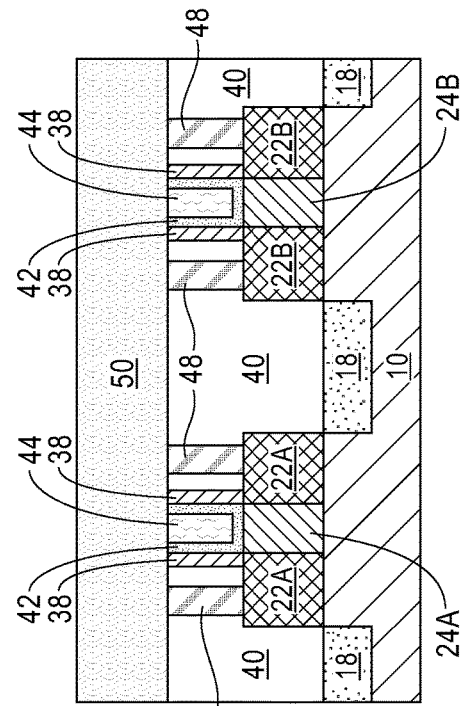
FIG. 6C is a cross-sectional view of the first exemplary semiconductor structure of FIG. 6A along line C-C'.
Figure 6B:
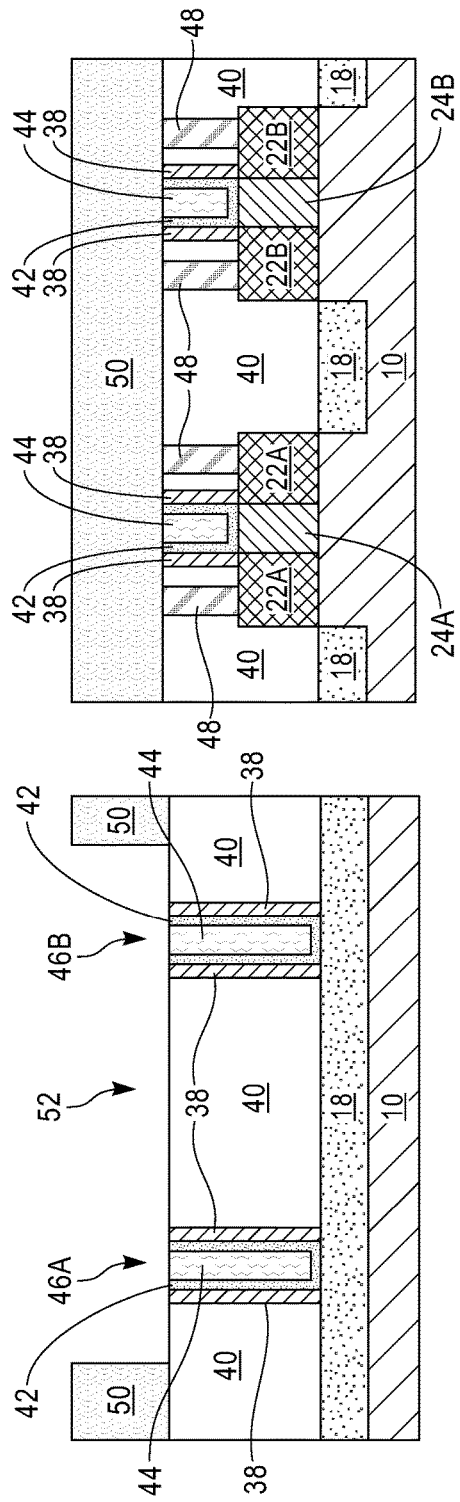
FIG. 6B is a cross-sectional view of the first exemplary semiconductor structure of FIG. 6A along line B-B'.

Referring now to FIGS. 6A-6C, there are illustrated the first exemplary semiconductor structure of FIGS. 5A-5C after forming a contact level dielectric layer 50 over the ILD layer 40, the functional gate stacks 46A, 46B, the gate spacers 38 and the source/drain contact structures 48 and forming a gate interconnect opening 52 exposing a portion of the first functional gate stack 46A and a portion of the second functional gate stack 46B located outside of the active regions (i.e., the semiconductor material portions 20A, 20B). In one embodiment and as shown, the gate interconnect opening 52 exposes a portion of each of the first and second functional gate stacks 46A, 46B located on the STI layer 18.

The contact level dielectric layer 50 may include one of the dielectric materials mentioned above for the ILD layer 40. In one embodiment, the dielectric material that provides the contact level dielectric layer 50 is a same dielectric material as that which provides the ILD layer 40. In another embodiment, the dielectric material that provides the contact level dielectric layer 50 is different than the dielectric material which provides the ILD layer 40. The contact level dielectric layer 50 can be formed utilizing one of the deposition processes mentioned above in forming the ILD layer 40. The thickness of the contact level dielectric layer 50 can be from 50 nm to 200 nm, although lesser and greater thicknesses can also be employed.

The gate interconnect opening 52 can be formed by a combination of lithographic patterning and anisotropic etching. A mask layer (not shown) is formed over the contact level dielectric layer 50, and then lithographically patterned to form an opening therein. The opening overlies an area in which a ferroelectric gate interconnect structure is subsequently formed. The mask layer can be a photoresist layer or a photoresist layer in conjunction with hard mask layer(s). The pattern in the mask layer is transferred through the contact level dielectric layer 50 by an anisotropic etch to provide the gate interconnect opening 52. The anisotropic etch can be a dry etch and/or a wet etch. After formation of the gate interconnect opening 52, the remaining portions of the mask layer can be removed by, for example, oxygen-based plasma etching.

Figure 7A:
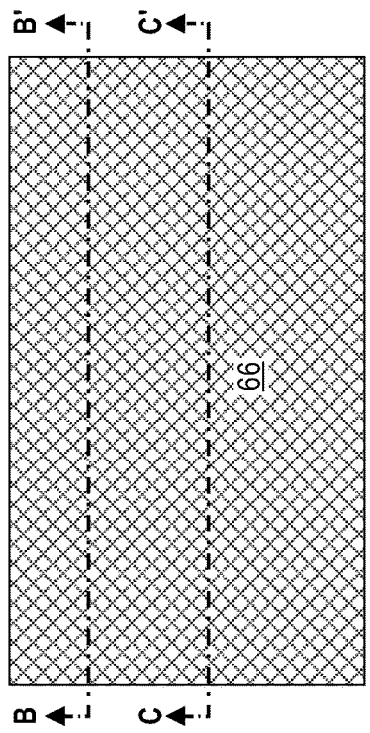
FIG. 7A is a top-down view of the first exemplary semiconductor structure of FIGS. 6A-6C after forming a stack of a bottom electrode material layer, a ferroelectric material layer and a top electrode material layer in the gate interconnect opening and on a topmost surface of the contact level dielectric layer.
Figure 7C:
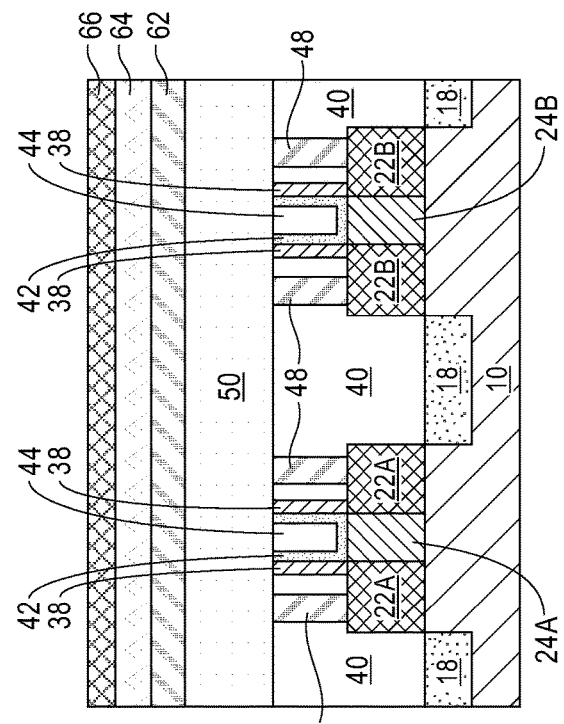
FIG. 7C is a cross-sectional view of the first exemplary semiconductor structure of FIG. 7A along line C-C'.
Figure 7B:
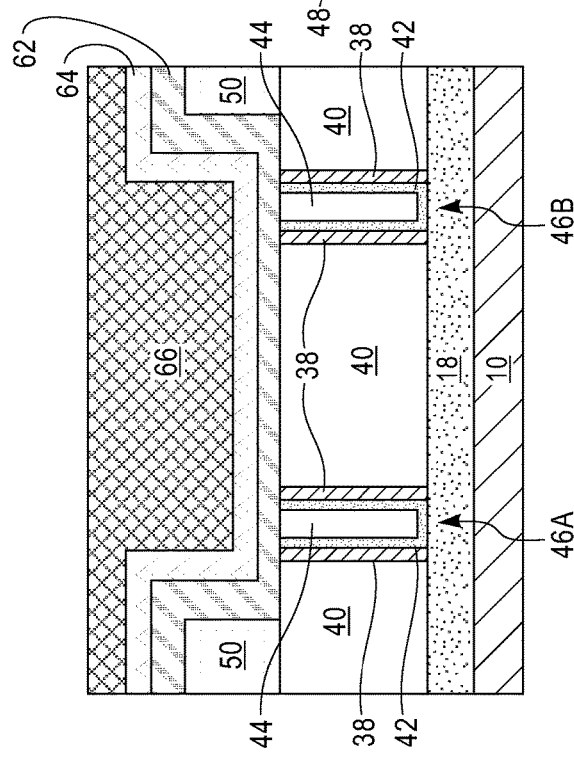
FIG. 7B is a cross-sectional view of the first exemplary semiconductor structure of FIG. 7A along line B-B'.

Referring now to FIGS. 7A-7C, there are illustrated the first exemplary semiconductor structure of FIGS. 6A-6C after forming a material stack of, from bottom to top, a bottom electrode material layer 62, a ferroelectric material layer 64 and a top electrode material layer 66. As is shown in FIGS. 7B and 7C, portions of each of the bottom electrode material layer 62, the ferroelectric material layer 64 and the top electrode material layer 66 are formed above the topmost surface of the contact level dielectric layer 50, while other portions of the bottom electrode material layer 62, the ferroelectric material layer 64 and the top electrode material layer 66 are formed within the gate interconnect opening 52.

The bottom electrode material layer 62 may include one of the conductive materials mentioned above for the gate electrode 44 of each functional gate stack 46A, 46B. Typically, but not necessarily always, the conductive material that provides bottom electrode material layer 62 is different from the conductive material that provides the gate electrode 44 of each functional gate stack 46A, 46B. In one example, the bottom electrode material layer 62 may include tungsten, while the gate electrode 44 may include titanium. The bottom electrode material layer 62 may be formed by a deposition process such as, for example, CVD or ALD. The bottom electrode material layer 62 has a thickness which does not fill in the entire volume of the gate interconnect opening 52. In one example, the thickness of the bottom electrode material layer 62 can be from 5 nm to 25 nm. As is shown, the bottom electrode material layer 62 includes a bottommost surface that contacts topmost surfaces of the first and second functional gate stacks 46A, 46B.

The ferroelectric material layer 64 may include any material that generates negative capacitance. Examples of materials that can be used as the ferroelectric material layer 64 include mixed metal oxides such as $BaTiO_3$, $Pb[Zr_x Ti_{1-x}]O_3$ ($0 \leq x \leq 1$), $SrBi_2Ta_2O_9$, and crystalline $HfO_2$ with a doping element selected from Zr, Al, Ca, Ce, Dy, Er, Gd, Ge, La, Sc, Si, Sr, Sn, and Y. The ferroelectric material layer 64 may be formed by a deposition process such as, for example, CVD or ALD. The ferroelectric material layer 64 also has a thickness which does not fill in the entire volume of the gate interconnect opening 52. In one example, the thickness of the ferroelectric material layer 64 can be from 5 nm to 25 nm.

The top electrode material layer 66 may include one of the conductive materials mentioned above for the bottom electrode material layer 62. In one embodiment, the conductive material that provides the top electrode material layer 62 comprises a same conductive material as that which provides the bottom electrode material layer 62. In one example, tungsten is used as the conductive material for both the bottom and top electrode material layers 62, 64. In another embodiment, the conductive material that provides the top electrode material layer comprises a different conductive material than that which provides the bottom electrode material layer 62. The top electrode material layer 66 may be formed by a deposition process such as, for example, CVD or ALD. The top electrode material layer 66 is deposited to a thickness to completely fill the gate interconnect opening 52

Referring now to FIGS. 8A-8C, there are illustrated the first exemplary semiconductor structure of FIGS. 7A-7C after forming a ferroelectric gate interconnect structure 70 within the gate interconnect opening 52. As is shown, a bottommost surface of the ferroelectric gate interconnect structure 70 directly contacts the topmost surfaces of the first and second functional stacks 46A, 46B.

The ferroelectric gate interconnect structure 70 can be formed by performing a planarization process to remove the top electrode material layer 66, the ferroelectric material layer 64 and the bottom electrode material layer 64 from above the topmost surface of the contact level dielectric layer 50, while maintaining portions of the top electrode material layer 66, the ferroelectric material layer 64 and the bottom electrode material layer 62 in the gate interconnect opening 52. The remaining portion of the top electrode material layer 66 is herein referred to as a top electrode structure 66P, the remaining portion of the ferroelectric material layer 64 is herein referred to as a ferroelectric material liner 64P, and the remaining portion of the bottom electrode material layer 62 is herein referred to as a bottom electrode structure 62P. The ferroelectric material liner 64P and the bottom electrode structure 62P are both U-shaped. Planarization may be performed by CMP and/or grinding.

Collectively, the top electrode structure 66, the ferroelectric material liner 64P and the bottom electrode structure 62P provide the ferroelectric gate interconnect structure 70 that electrically connects the underlying functional gate stacks 46A, 46B. As is shown, the topmost surface of the top electrode structure 66P and the topmost surfaces of the vertical extending portions of both of the ferroelectric material liner 64P and the bottom electrode structure 62P are coplanar with each other as well as being coplanar with the topmost surface of the contact level dielectric layer 50. As is further shown, the bottom electrode structure 62P extends across the first and the second functional gate stacks 46A, 46B, and the bottom electrode structure 62P is located entirely beneath the ferroelectric material liner 64P. The ferroelectric gate interconnect structure 70 functions as a ferroelectric capacitor for attaining steep sub-threshold CMOS transistors.

After forming the ferroelectric gate interconnect structure 70, normal back-end-of-line (BEOL) processing can be performed to form multilevel interconnect structures (not shown).

Because a ferroelectric capacitor typically occupies large areas in a circuit layout, in the present application, by introducing a ferroelectric material into an interconnect structure for contacting and routing purposes, rather than embedding it into a gate stack of a transistor, the packing density of the transistors is maintained.

Figure 9:
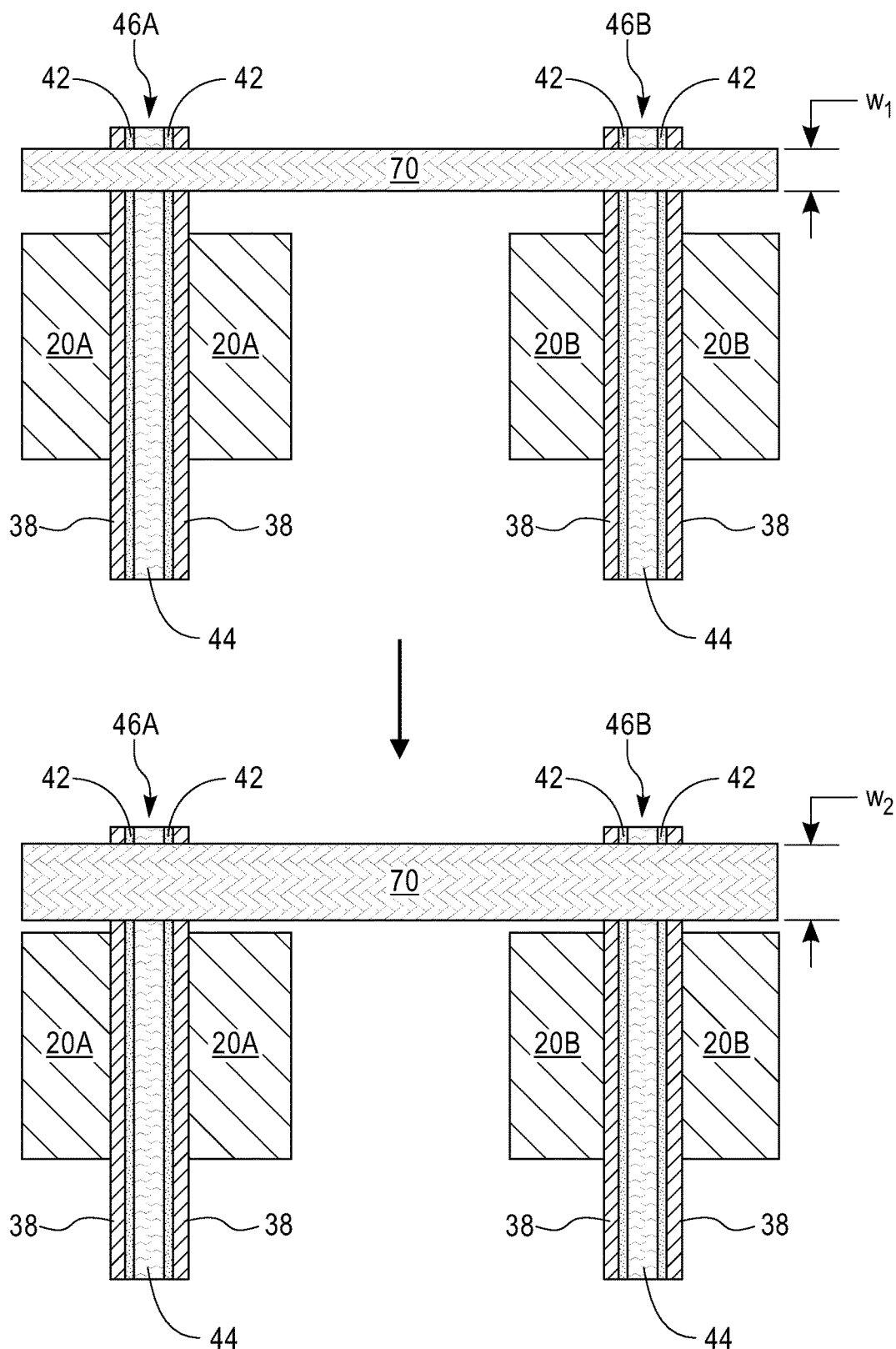
FIG. 9 is top-down views of ferroelectric gate interconnect structures with different widths.

To increase device performance, the ferroelectric capacitance and gate capacitance should be matched. In the present application, introducing the ferroelectric material into the interconnect structure allows easy tuning of the ferroelectric capacitance of the resulting ferroelectric capacitor. As shown in FIG. 9, by increasing the width of the ferroelectric gate interconnect structure 70, the effective area of the ferroelectric gate interconnect structure 70 is increased, which in turn leads to an increase of the ferroelectric capacitance. This can greatly simply fabrication process and reduce fabrication cost.

Figure 10:
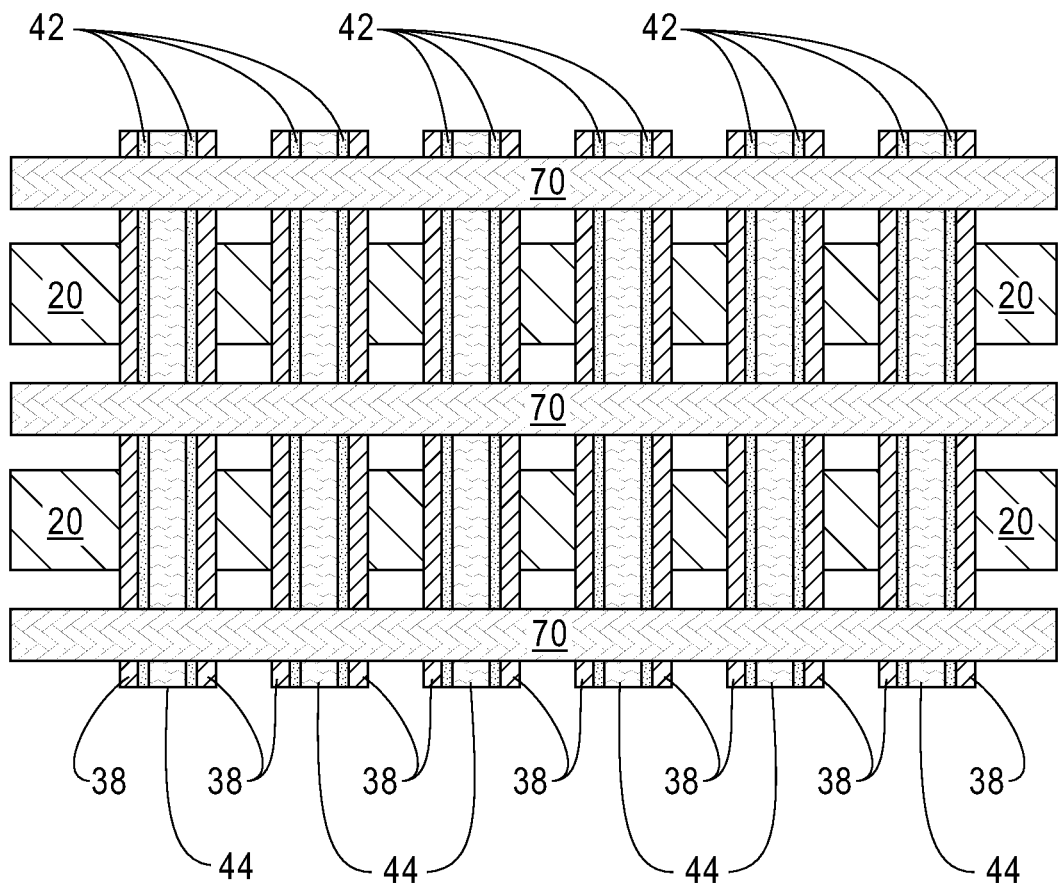
FIG. 10 is a top-down view of a first exemplary circuit layout employing the ferroelectric gate interconnect structures of the present application.

Referring now to FIG. 10, there is illustrated a first exemplary circuit layout employing ferroelectric gate interconnect structures of the present application. As shown, the ferroelectric gate interconnect structures 70 connects a plurality of shared functional gate structure (46, 38) extended over a plurality of semiconductor material portions 20. In the present application, by incorporation of the ferroelectric material in the gate interconnect structures 70, the functional gate structures (46, 38) can still be formed at a tight pitch (on the order of 45 nm or less), thereby allowing for high device packing density.

Figure 11:
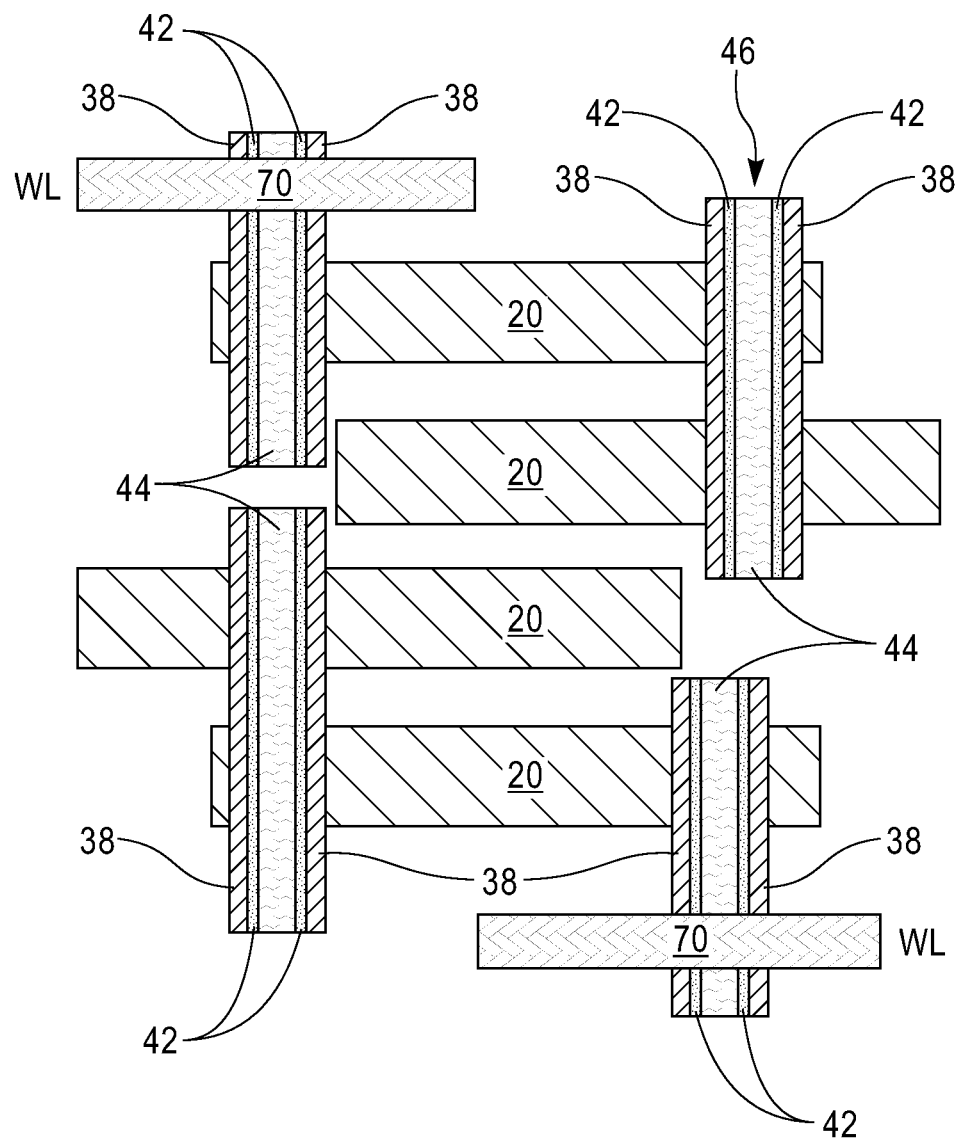
FIG. 11 is a top-down view of a second exemplary circuit layout employing the ferroelectric gate interconnect structures of the present application.

Referring now to FIG. 11, there is illustrated a second exemplary circuit layout employing ferroelectric gate interconnect structures of the present application. As shown, the ferroelectric gate interconnect structures 70 are used as word-lines coupled to functional gate structures (46, 38) of memory cells, thereby allowing for memory cells with low-leakage and low-power word-lines.

Figure 12A:
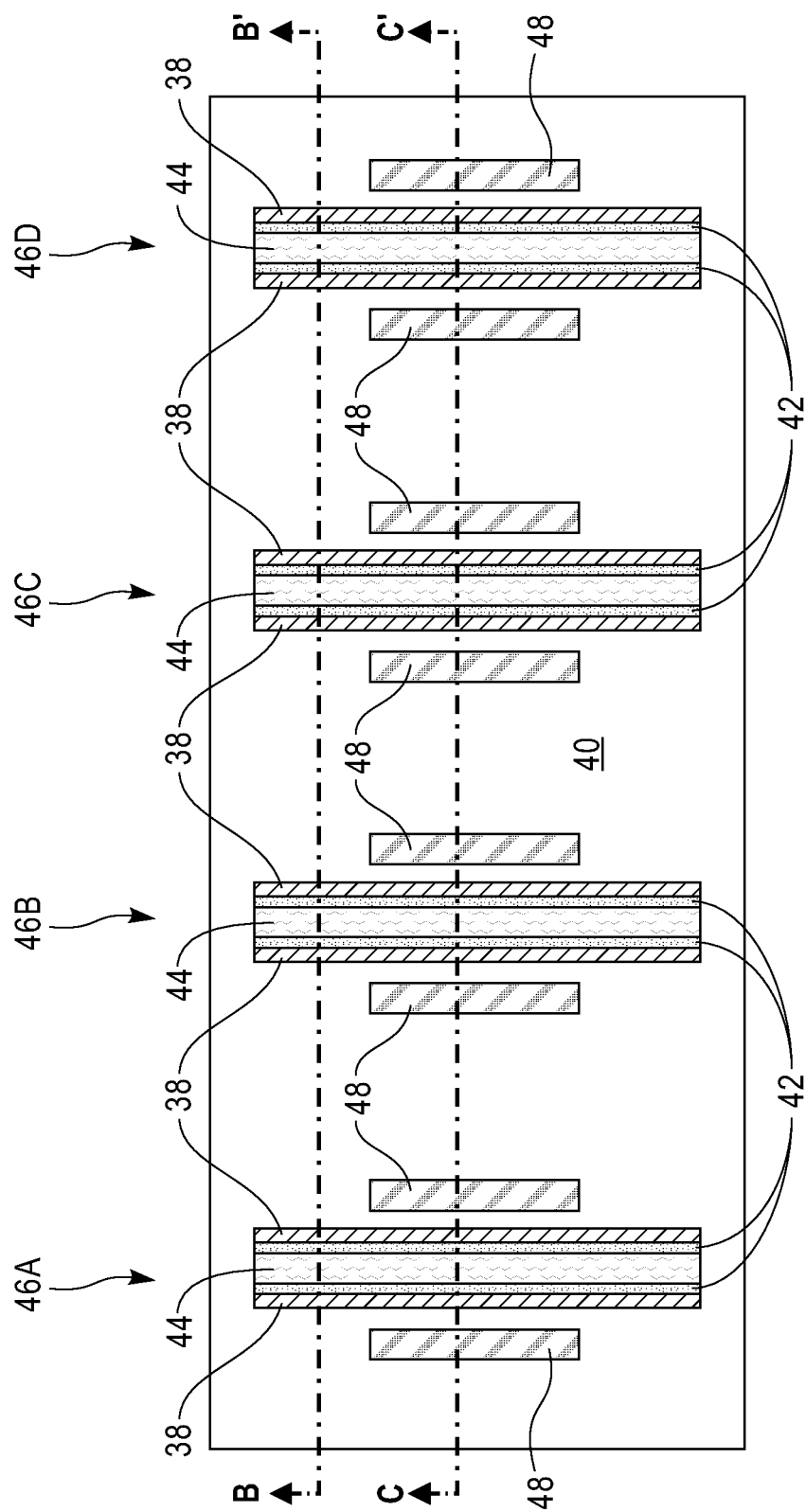
FIG. 12A is a top-down view of a second exemplary semiconductor structure including a first FET located in a first device region of a substrate, a second FET located in a second device region of the substrate, a third FET located in a third device region of the substrate, and a fourth FET located in a fourth device region of the substrate in accordance with a second embodiment of the present application.
Figure 12B:
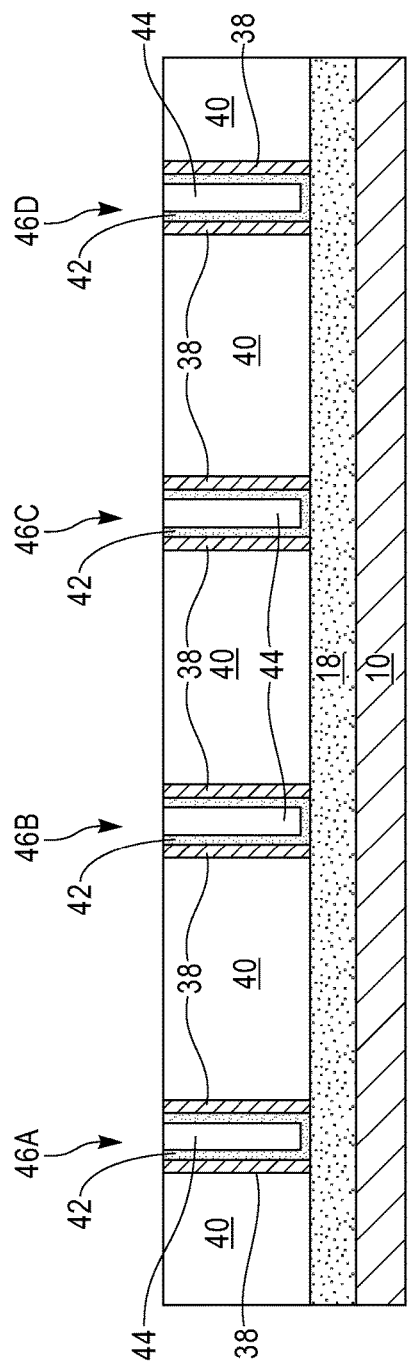
FIG. 12B is a cross-sectional view of the second exemplary semiconductor structure of FIG. 11A along line B-B'.
Figure 12C:
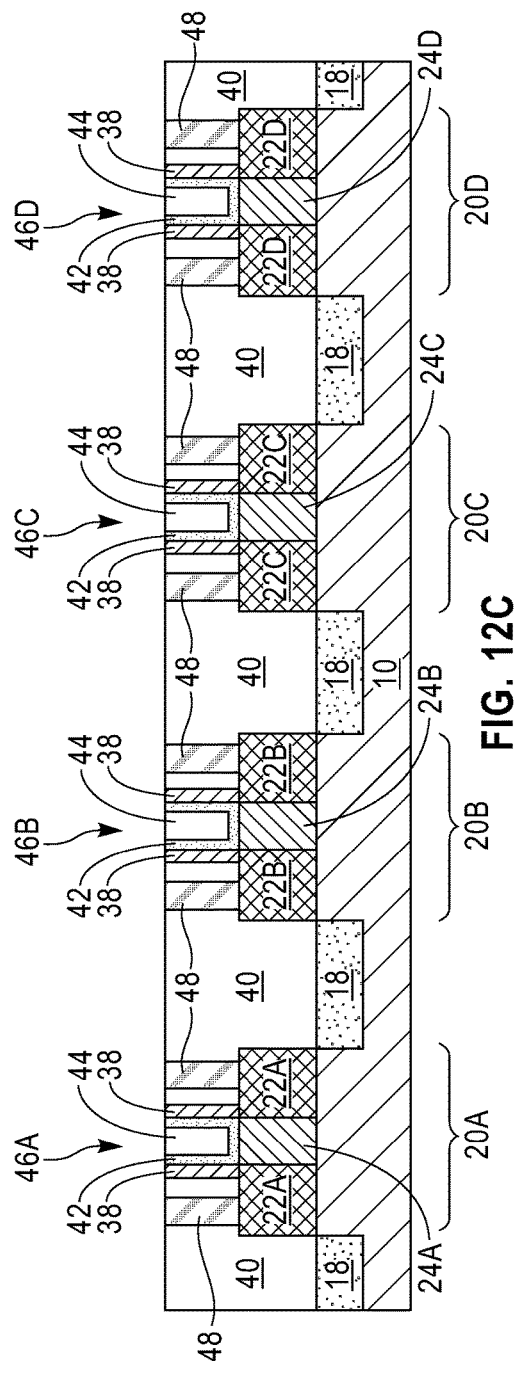
FIG. 12C is a cross-sectional view of the second exemplary semiconductor structure of FIG. 11A along line C-C'.

Referring now to FIGS. 12A-12C, there are illustrated a second exemplary semiconductor structure in accordance with a second embodiment of the present application. The second exemplary semiconductor structure includes a first FET located in a first device region of a substrate 10, a second FET located in a second device region of the substrate 10, a third FET located in a third device region of the substrate 10, and a fourth FET located in a fourth device region of the substrate 10. In one embodiment, the first and the third device regions can be pFET regions, and the second and the fourth device region can be nFET regions.

The first FET includes a first functional gate stack 46A located on a first body region 24A of a first semiconductor material portion 20A and first source/drain regions 22A located within the first semiconductor material portion 20A and laterally surrounding the first body region 24A. The second FET includes a second functional gate stack 46B located on a second body region 24B of a second semiconductor material portion 20B and second source/drain regions 22B located within the second semiconductor material portion 20B and laterally surrounding the second body region 24B. The third FET includes a third functional gate stack 46C located on a third body region 24C of a third semiconductor material portion 20C and third source/drain regions 22C located within the third semiconductor material portion 20C and laterally surrounding the third body region 24C. The fourth FET includes a fourth functional gate stack 46D located on a fourth body region 24C of a fourth semiconductor material portion 20C and fourth source/drain regions 22D located within the fourth semiconductor material portion 20C and laterally surrounding the fourth body region 24D.

Each functional gate stack 46A, 46B, 46C, 46D includes a gate dielectric 42 and a gate electrode surrounded by the gate dielectric 42. Each FET also includes a gate spacer 38 present on sidewalls of each functional gate stack 46A, 46B, 46C, 46D. Source/drain contact structures 48 extend through an ILD layer 40 that laterally surrounds the functional gate stacks 46A, 46B, 46C, 46D, forming contact with the source/drain regions 22A, 22B, 22C, 22D.

Various components of the first, second, third and fourth FETs, the ILD layer 40 and the source/drain contact structures 48 can be formed utilizing processing steps described above in FIGS. 1A-1C, FIGS. 2A-2C, FIGS. 3A-3C, FIGS. 4A-4C and FIGS. 5A-5C.

Figure 13A:
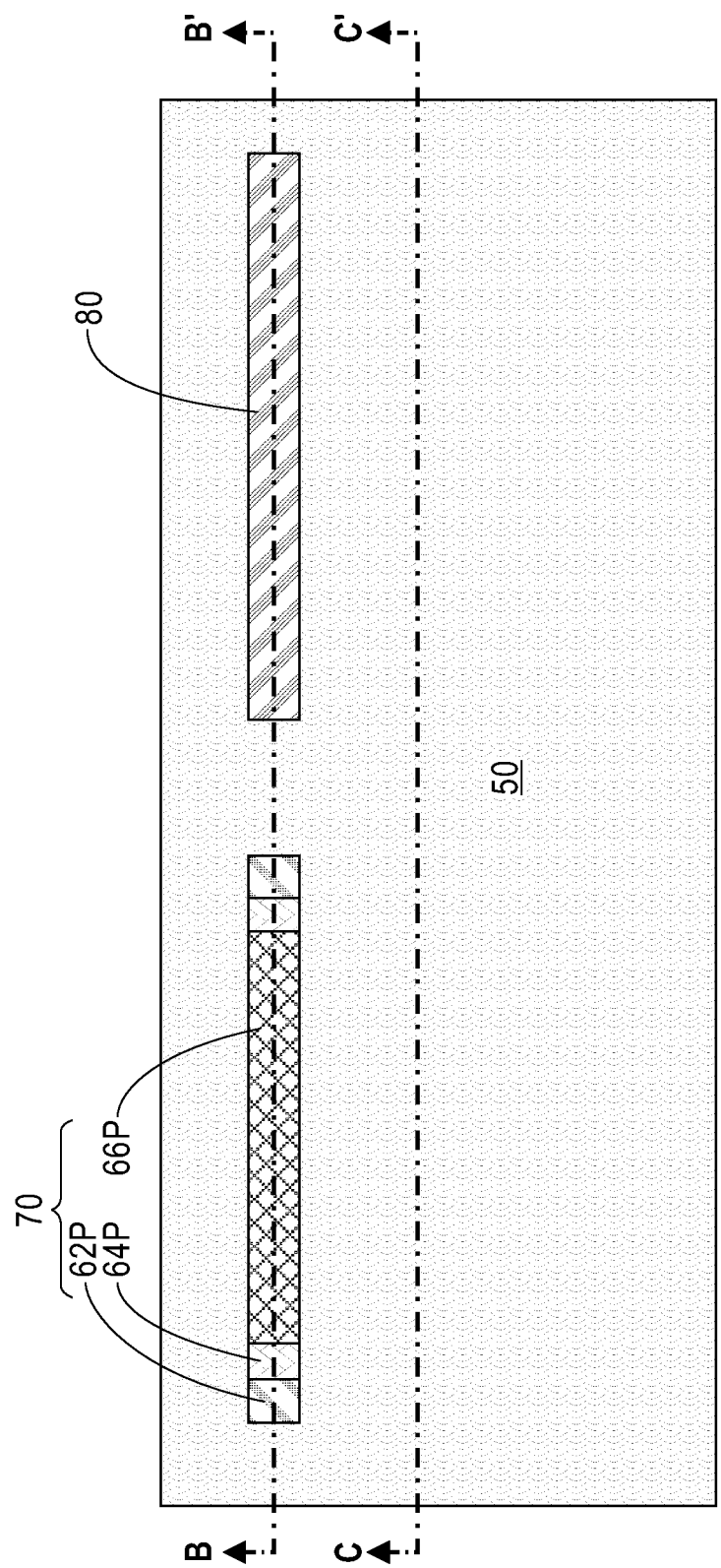
FIG. 13A is a top-down view of the second exemplary semiconductor structure of FIGS. 12A-12C after forming a ferroelectric gate interconnect structure connecting a first functional gate stack in the first FET and a second functional gate stack in the second FET and forming a metal gate interconnect structure connecting a third functional gate stack in the third FET and a fourth functional gate stack in the fourth FET.
Figure 13B:
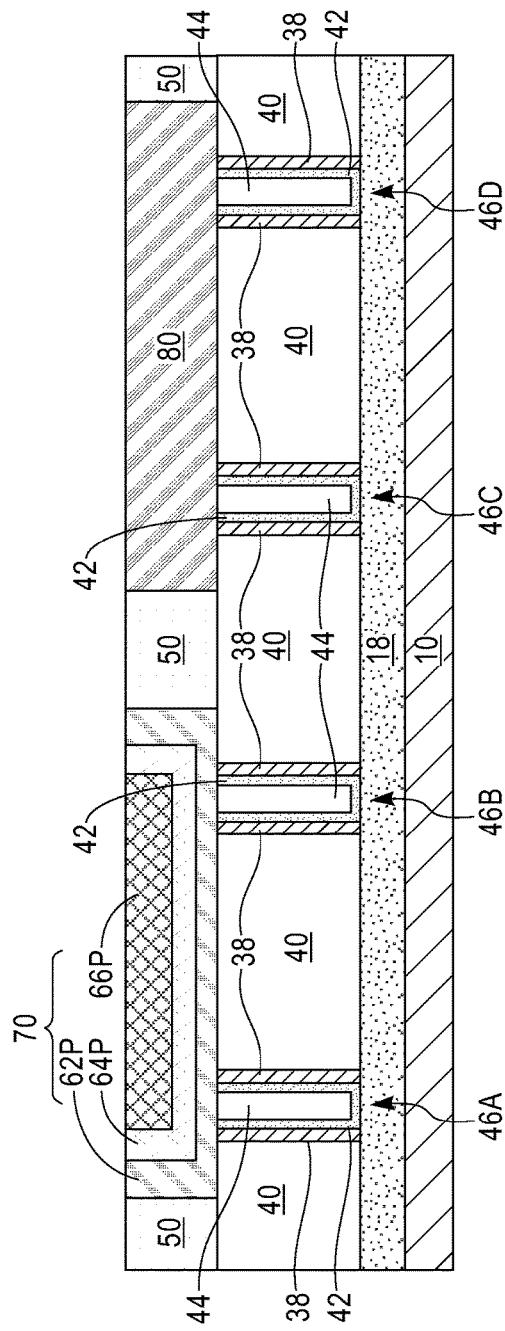
FIG. 13B is a cross-sectional view of the second exemplary semiconductor structure of FIG. 13A along line B-B'.
Figure 13C:
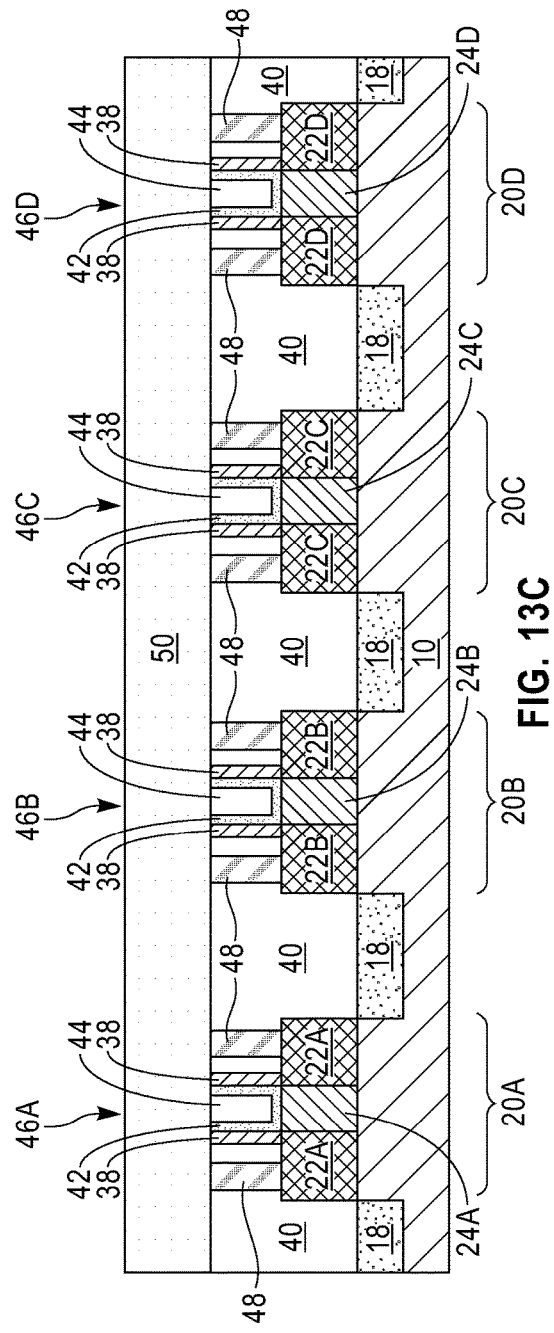
FIG. 13C is a cross-sectional view of the second exemplary semiconductor structure of FIG. 13A along line C-C'.

Referring now to FIGS. 13A-13C, there are illustrated the second exemplary semiconductor structure of FIGS. 12A-12C after forming a ferroelectric gate interconnect structure 70 connecting the first and second functional gate stacks 46A, 46B and a metal gate interconnect structure 80 connecting the third and fourth functional gate stacks 46C, 46D.

The ferroelectric gate interconnect structure 70 can be formed by performing the processing steps described above in FIGS. 6A-6C, FIGS. 7A-7C and FIGS. 8A-8C while masking the third and fourth devices regions. After or prior to the formation of the ferroelectric gate interconnect structure 70, the metal gate interconnect structure 80 can be formed by forming another gate interconnect opening exposing the third and fourth gate stacks 46C, 46D by lithography patterning and etching while masking the first and second device regions, followed by depositing a metal to completely fill the another gate interconnect opening. The metal that provides the metal gate interconnect structure 80 can be the same as, or different from, the metal that provides the bottom electrode structure 62P and/or the top electrode structure 64P. In one example, tungsten is used as the metal for the metal gate interconnect structure 80.

The methods of the embodiments of the present application thus can provide two types of gate interconnect structures, i.e. ferroelectric gate interconnect structure and conventional metal gate interconnect structure on a same chip, thereby allowing more fabrication and application flexibility.

Figure 14A:
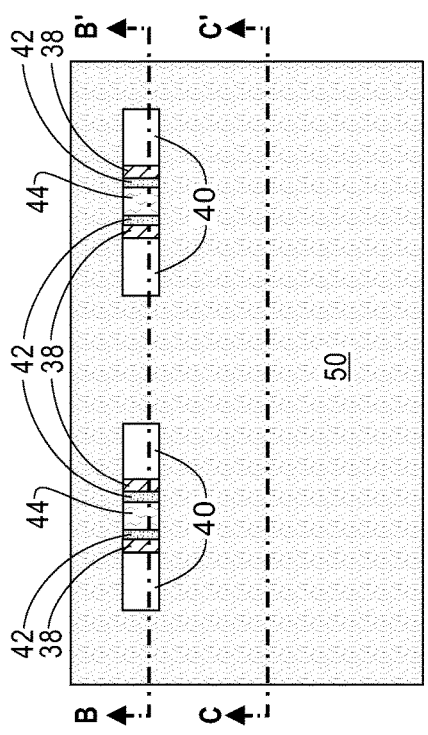
FIG. 14A is a top-down view of a third exemplary semiconductor structure that can be derived from FIGS. 5A-5C of the first exemplary semiconductor structure after forming a contact level dielectric layer and forming a first gate contact opening exposing a portion of the first functional gate stack that is located outside of the first semiconductor material portion and a second gate contact opening exposing a portion of the second functional gate stack that is located outside of the second semiconductor material portion in accordance with a third embodiment of the present application.
Figure 14B:
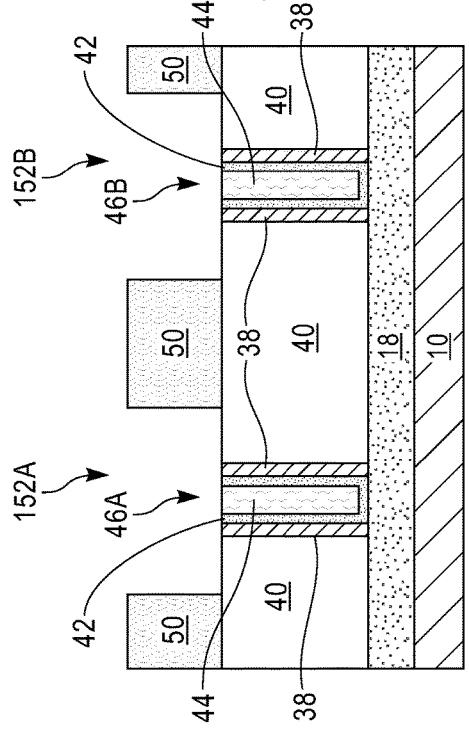
FIG. 14B is a cross-sectional view of the third exemplary semiconductor structure of FIG. 14A along line B-B'.
Figure 14C:
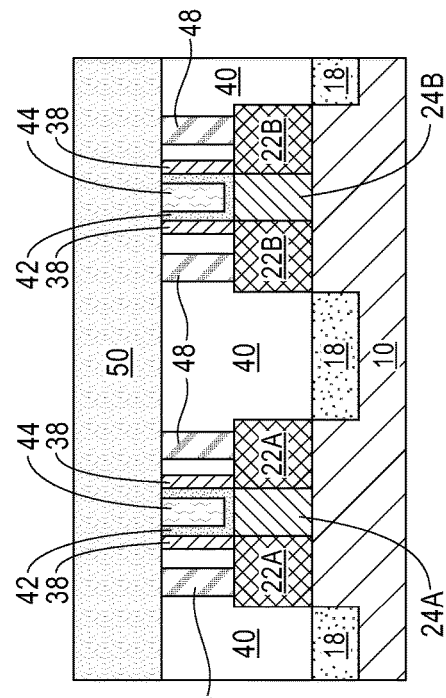
FIG. 14C is a cross-sectional view of the third exemplary semiconductor structure of FIG. 14A along line C-C'.

Referring now to FIGS. 14A-14C, there are illustrated a third exemplary semiconductor structure in accordance with a third embodiment of the present application that can be derived from FIGS. 5A and 5B after forming a contact level dielectric layer 50 and forming a first gate contact opening 152A exposing a portion of the first functional gate stack 46A located outside of the first active region (i.e., the first semiconductor material portion 20A) and a second gate contact opening 152B exposing a portion of the second functional gate stack 46B located outside of the second active region (i.e., the second semiconductor material portion 20B). Thus, the first gate contact opening 152A exposes a portion of the first functional gate stack 46A located on the STI layer 18, and the second gate contact opening 152B exposes a portion of the second functional gate stack 46B located on the STI layer 18. The contact level dielectric layer 50, the first gate contact opening 152A and the second gate contact opening 152B can be formed by performing processing steps described above in FIGS. 6A-6C.

Figure 15A:
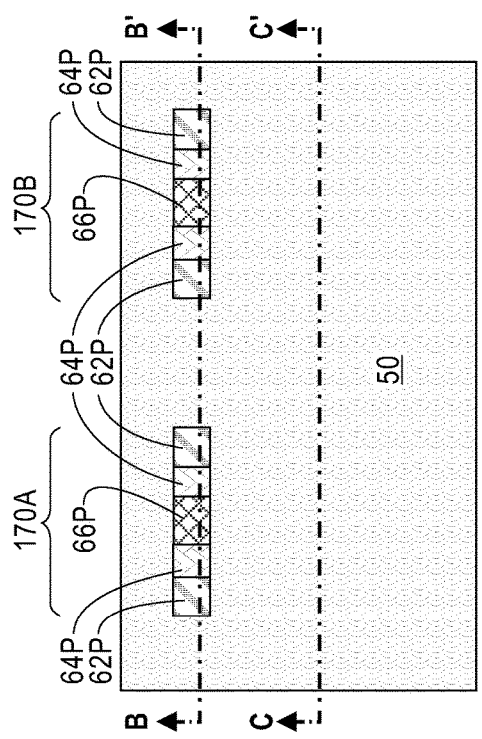
FIG. 15A is a top-down view of the third exemplary semiconductor structure of FIGS. 14A-14C after forming a first ferroelectric gate contact structure within the first gate contact opening and a second ferroelectric gate contact structure within the second gate contact opening.
Figure 15C:
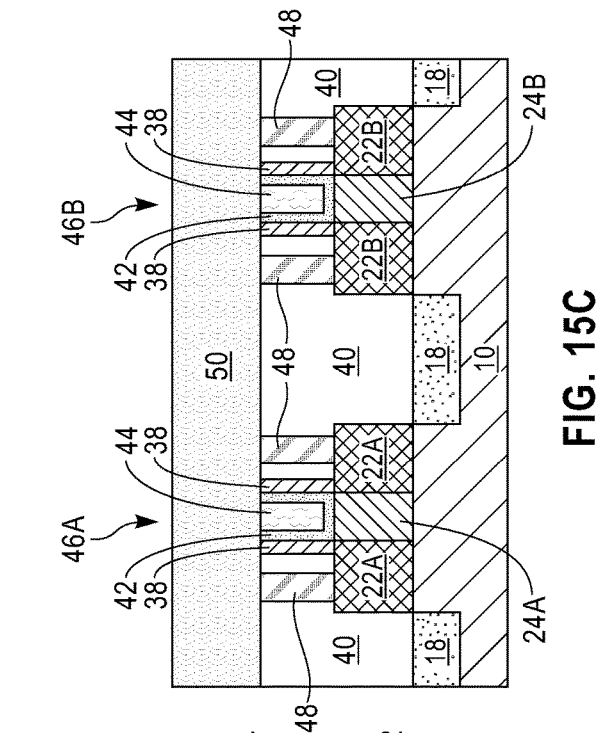
FIG. 15C is a cross-sectional view of the third exemplary semiconductor structure of FIG. 15A along line C-C'.
Figure 15B:
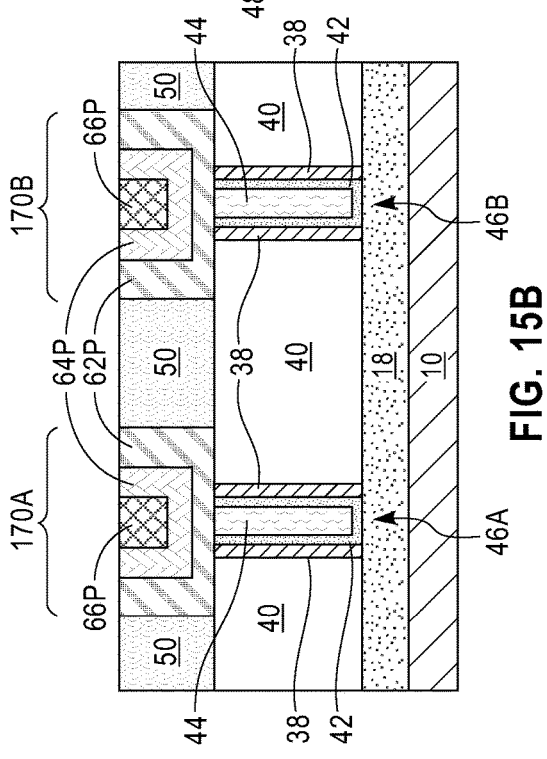
FIG. 15B is a cross-sectional view of the third exemplary semiconductor structure of FIG. 15A along line B-B'.

Referring to FIGS. 15A-15C, there are illustrated the third exemplary semiconductor structure of FIGS. 14A-14C after forming a first ferroelectric gate contact structure 170A within the first gate contact opening 152A to contact the first functional gate stack 46A and a second ferroelectric gate contact structure 170B within the second gate contact opening 152B to contact the second functional gate stack 46B. Each of the first ferroelectric gate contact structure 170A and the second ferroelectric gate contact structure 170B includes a stack of a bottom electrode structure 62P, the ferroelectric material liner 64P and the top electrode structure 66. The first ferroelectric gate contact structure 170A and the second ferroelectric gate contact structure 170B can be formed utilizing processing steps described above in FIGS. 7A-7C and FIGS. 8A-8C.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a first functional gate stack located on a first body region of a first semiconductor material portion located in a first region of a substrate;
a second functional gate stack located on a second body region of a second semiconductor material portion located in a second region of the substrate; and
a ferroelectric gate interconnect structure connecting the first functional gate stack and the second functional gate stack, wherein the ferroelectric gate interconnect structure vertically contacts a portion of the first functional gate stack located outside the first semiconductor material portion and a portion of the second functional gate stack located outside the second semiconductor material portion.

2. The semiconductor structure of claim 1, wherein the ferroelectric gate interconnect structure comprises a bottom electrode structure, a ferroelectric material liner and a top electrode structure.

3. The semiconductor structure of claim 2, wherein the bottom electrode structure is U-shaped having a bottom portion located directly above, and in contact with, a topmost surface of each of the first functional gate stack and the second functional gate stack.

4. The semiconductor structure of claim 3, wherein the U-shaped bottom electrode structure is located entirely beneath the U-shaped ferroelectric material liner.

5. The semiconductor structure of claim 1, further comprising a shallow trench isolation (STI) layer over the substrate and surrounding a bottom portion of each of the first semiconductor material portion and the second semiconductor material portion, wherein each of the first functional gate stack and the second functional gate stack extends over to the STI layer.

6. The semiconductor structure of claim 3, further comprising an interlevel dielectric (ILD) layer laterally surrounding the first functional gate stack and the second functional gate stack.

7. The semiconductor structure of claim 6, further comprising a contact level dielectric layer laterally surrounding the ferroelectric gate interconnect structure, wherein the contact level dielectric layer is located above, and in direct contact with, a topmost surface of the ILD layer.

8. The semiconductor structure of claim 6, wherein a topmost surface of the contact level dielectric layer is coplanar with a topmost surface of the top electrode structure, topmost surfaces of vertical extending portions of the U-shaped ferroelectric material liner, and topmost surfaces of vertical extending portions of the U-shaped bottom electrode structure.

9. The semiconductor structure of claim 1, further comprising first source/drain regions within the first semiconductor material portion and laterally surrounding the first body region, and second source/drain regions within the second semiconductor material portion and laterally surrounding the second body region.

10. The semiconductor structure of claim 1, further comprising:
a third functional gate stack located on a third body region of a third semiconductor material portion located in a third region of a substrate;
a fourth functional gate stack located on a fourth body region of a fourth semiconductor material portion located in a fourth region of the substrate; and
a metal gate interconnect structure connecting the third functional gate stack and the fourth functional gate stack.

* * * * *